United States Patent
Nishida et al.

(10) Patent No.: US 6,461,934 B2
(45) Date of Patent: Oct. 8, 2002

(54) METHOD OF MANUFACTURING SEMICONDUCTOR DEVICE HAVING TRENCH TYPE ELEMENT ISOLATION REGIONS

(75) Inventors: Yukio Nishida; Shuichi Ueno; Masashi Kitazawa, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/862,311

(22) Filed: May 23, 2001

(65) Prior Publication Data

US 2001/0036705 A1 Nov. 1, 2001

Related U.S. Application Data

(62) Division of application No. 09/288,282, filed on Apr. 8, 1999.

(51) Int. Cl.$^7$ ............................................... H01L 21/76
(52) U.S. Cl. ...................................... 438/424; 438/427
(58) Field of Search ...................... 438/427, 424–426, 438/400

(56) References Cited

U.S. PATENT DOCUMENTS 4,255,207 A * 3/1981 Nicolay et al. .... 148/DIG. 168
4,269,636 A * 5/1981 Rivoli et al. ....... 148/DIG. 168

* cited by examiner

Primary Examiner—Jey Tsai
(74) Attorney, Agent, or Firm—Oblon, Spivak, McClelland, Maier & Neustadt, P.C.

(57) ABSTRACT

Trench isolation regions of different depths are formed through a simple manufacturing process, and reliability of a semiconductor device is increased. Trenches (103a, 103b) of different widths are formed on a semiconductor substrate (101) on which an underlying film (104) such as a silicon oxide film and a mask material (105) such as a silicon nitride film are formed. Then, an insulating film such as a silicon oxide film is deposited over the entire surface to such a degree that the narrower trench (103a) is filled up. At this time, the wider trench (103b) has an unfilled space in its central portion. a The surface of the substrate (101) is then vertically etched back until it is exposed in the trench 103b. With insulating films (106a, 106b) in the trenches (103a, 103b) as a mask, the surface of the substrate (101) is anisotropically etched vertically to form a deeper bottom (103c) in the trench (103b). After that, the surface is planarizedby depositing an insulating film in the unfilled space of the trench (103b).

6 Claims, 10 Drawing Sheets

METHOD OF MANUFACTURING SEMICONDUCTOR DEVICE HAVING TRENCH TYPE ELEMENT ISOLATION REGIONS

This is a divisional of application Ser. No. 09/288,282, filed Apr. 8, 1999.

BACKGROUND OF THE INVENTION

1. Field of the Invention

The present invention relates to a semiconductor device having trench type element isolation regions, and a method of manufacturing the device.

2. Description of the Background Art

In order to control respective elements quite independently during operation of semiconductor integrated circuits without electrical interference therebetween, the semiconductor integrated circuits require element isolation regions formed therein. One of well-known methods for forming element isolation regions is the trench isolation method, to which various improvements have been made.

The trench isolation method is an element isolation method of providing a trench isolation region by forming a trench in a substrate and filling that trench with a filler material. This method causes little bird's beak that is frequently associated with the LOCOS method, a typical method for forming element isolation regions. Thus, it is an indispensable element isolation forming method to achieve higher density of semiconductor integrated circuits.

FIG. 13 is a cross-sectional view of a semiconductor device D1 formed by an ordinary trench isolation method. The semiconductor device D1 comprises, in N- and P-wells 316, 317 formed on the surface of a semiconductor substrate 301, trench isolation regions 302 and 303 having isolation lengths L2 and L1, respectively; a P-type MOS transistor M1 consisting of a gate electrode 304, a gate insulating film 305, and P$^+$ source/drain diffusion layers 306 and 307; a P-type MOS transistor M2 consisting of a gate electrode 308, a gate insulating film 309, and P$^+$ source/drain diffusion layers 310 and 311; and an N-type MOS transistor M3 consisting of a gate electrode 312, a gate insulating film 313, and N$^+$ source/drain diffusion layers 314 and 315. It is noted that a potential Vnsub is applied to the N-well 316.

The trench isolation region formed across the boundary between the N-well 316 and the P-well 317, namely, an well isolation region 303, must suppress punch-through between the P-well 317 and the P$^+$ source/drain diffusion layer 311 which is closest to the P-well 317 in the N-well 316 or punch-through between the N-well 316 and the N$^+$ source/drain diffusion layer 314 which is closest to the N-well 316 in the P-well 317. When the well isolation region 303 is formed shallower than the wells 316 and 317 as in the semiconductor device D1, in order to suppress the punch-through, the isolation length L1 of the well isolation region 303 must be longer than the isolation length L2 of the trench isolation region formed between the adjacent P-type MOS transistors M1 and M2 in the N-well 316 (i.e., in-well isolation region 302) to minimize contact between a depletion layer in the vicinity of each well and a depletion layer in the vicinity of each source/drain diffusion layer. The increase in the isolation length L1, however, causes a difficulty in reducing circuit area.

On the other hand, if deep trench isolation regions 402 and 403 are formed to establish an electrical isolation between the N-well 316 and the P-well 317 as in a semiconductor device D2 of FIG. 14, the isolation length L1 can be reduced. In the ordinary process, however, the trench isolation regions 402 and 403 are formed in the same step, so that both regions have the same depth from the surface of the semiconductor substrate 301. If the in-well isolation region 402 is formed as deep as the well isolation region 403 as shown in FIG. 14, the N-well 316 will be divided into an N-well 316a having the P-type MOS transistor M1 and an N-well 316b having the P-type MOS transistor M2, which are electrically isolated from each other. This creates the need for applying a potential Vnsub separately to the N-wells 316a and 316b, offering a drawback to the reduction in circuit area.

To resolve the aforementioned problems, there is provided a semiconductor device D3 shown in FIG. 15 in which according to the characteristics of regions to be isolated, only a specific isolation region is formed deep. In the semiconductor device D3, an in-well isolation region 502 is formed shallower than the N-well 316, so that both P-type MOS transistors M1 and M2 are in contact with the N-well 316. Thus, applying a potential Vnsub only to a single given portion of the N-well 316 is enough to obtain substrate potentials of those transistors. Further, an well isolation region 503 has a portion formed deeper than the in-well isolation region 502. That portion establishes an electrical isolation between the N-well 316 and the P-well 317. Thus, there is no need to increase the isolation length L1.

U.S. Pat. No. 5,536,675 and U.S. Pat. No. 5,411,913, for example, show techniques for manufacturing such a semiconductor device. We will describe the outline of these techniques. First, shallow trenches are formed in any place which would require isolation, by using the photolithographic technique. Then, the photolithographic technique is again used to form a deeper trench in any shallow trench that would require a deeper trench structure. Finally, all trenches are filled with a filler material.

These techniques, however, utilize the photolithographic technique two times to form trenches, so that they require at least two photomasks for resist formation, increasing manufacturing cost. In addition, forming a deeper trench in a shallow trench causes a problem of alignment accuracy of the second photomask.

Another method for manufacturing a structure similar to the semiconductor device D3 of FIG. 15 is disclosed in Japanese Patent Laid-Open No. 63-144540A. We will explain this method referring to FIGS. 16 to 20. First, a mask material 105 such as a silicon nitride film is formed on a semiconductor substrate 101. The mask material 105 is patterned to form wide and narrow openings. The substrate is then anisotropically etched through the mask material 105 to form trenches 103a and 103b having the same depth but different isolation lengths La and Lb (La<Lb), respectively, in the semiconductor substrate 101 (FIG. 16). After removing impurities or defects from the bottom and side surfaces of the trenches 103a and 103b by appropriate post-treatment such as etching, insulating films 108a and 108b such as a silicon oxide film are formed to protect the side and bottom surfaces of the trenches 103a and 103b. Further, an oxidation-resistant film 109 such as a silicon nitride film is deposited to protect the side and bottom surfaces of the trenches 103a and 103b from polycrystalline silicon to be filled and oxidized in the subsequent steps. Then, a polycrystalline silicon film 107 is deposited over the entire surface to such a thickness that the trench 103a is completely filled and the trench 103b has an unfilled space in its central portion (FIG. 17). The surface of the semiconductor substrate 101 is then anisotropically etched vertically. At this time, the polycrystalline silicon film 107a fills up the trench 103a, and the polycrystalline silicon film 107b remains only on the side surface of the trench 103b, exposing the oxidation-resistant film 109 at its bottom (FIG. 18). By heating this state of the semiconductor substrate 101 in an oxidizing atmosphere, the surfaces or the whole of the polycrystalline silicon films 107a and 107b are turned to be oxide films 110a and 110b. Then, with the oxide films 110a and 110b as masks, the oxidation-resistant film 109, the insulating film 108b, and the substrate 101 all at the bottom of the trench 103b are further etched to form a deeper bottom portion 103c in the trench 103b (at this time, the oxidation-resistant film 109 is simultaneously etched and divided into oxidation-resistant films 109a and 109b). In this fashion, the T-shaped trench 103b is formed (FIG. 19). The surface of this newly etched portion is covered with an insulating film 108c such as a silicon oxide film, and then the trench 103b other than the oxide film 110b is filled with a filling material 111 such as polycrystalline silicon (FIG. 20). After that, surface planarity of the semiconductor substrate 101 is produced by polishing, thereby completing a semiconductor device having trench isolation regions of different depths.

Although different from the semiconductor device D3 of FIG. 15, Japanese Patent Laid-Open No. 60-92632A discloses a method of manufacturing a semiconductor device having trench isolation regions of different depths. FIGS. 21 to 23 show a manufacturing method disclosed as a conventional technique in the publication. On a silicon substrate 201 having the (100) plane, a silicon oxide film 205 is formed and then patterned to form a narrow opening 202a and a wide opening 202b (FIG. 21). With the silicon oxide film 205 as a mask, the silicon substrate 201 is etched using a caustic potash solution to form trenches 203a and 203b in the shape of an inverted triangle (FIG. 22). That shape of the trenches 203a and 203b is due to the etch rate of the (100) plane that is faster than that of the (111) plane. In this case, the ratio of trench depth to opening width is almost constant, so that the openings 202a and 202b having different widths result in the inverted-triangular trenches 203a and 203b of different depths. The surfaces of the trenches 203a and 203b are then oxidized to form silicon oxide films 208a and 208b, and polycrystalline silicon films 206a and 206b are deposited thereon (FIG. 23). After that, surface planarity of the substrate 201 is produced by polishing, thereby completing a semiconductor device having inverted-triangular trench isolation regions of different depths.

Both techniques disclosed in Japanese Patent Laid-Opens No. 63-144540A and No. 60-92632A require only a single photomask to form the trench isolation regions of different depths, and they can form those regions in a self-aligned manner according to the widths of the previously formed openings. Accordingly, they have no problem in aligning a plurality of photomasks with accuracy, and the manufacturing steps thereof become simple and easily adaptable to higher density of a device.

The aforementioned conventional techniques, however, utilize polycrystalline silicon as a filler material of trenches. Polycrystalline silicon has superior step-covering properties and can be deposited thick with comparative ease. Thus, in these respects, it is suitable as a filler material of trenches. Being not an insulator, however, polycrystalline silicon might cause a short circuit between regions to be electrically isolated by the trench isolation regions. This becomes a drawback in improving reliability of semiconductor devices.

To improve insulation performance, there is also a method of subjecting polycrystalline silicon to thermal oxidation after filling the trenches, like the oxide films 110a and 110b in FIG. 19. Such a method, however, has a problem that volume expansion of polycrystalline silicon during oxidation apply pressure to the inner walls of the trenches, and the resultant stress or crystal defects arising in the semiconductor substrate become a drawback in improving reliability of semiconductor devices.

SUMMARY OF THE INVENTION

A first aspect of the present invention is directed to a method of manufacturing a semiconductor device comprising the steps of: (a) preparing a semiconductor substrate having a surface and on the surface, forming a mask material with a first opening having a first width and a second opening having a second width greater than the first width; (b) performing etching using the mask material as a mask to form a first trench having a first depth in an exposed portion of the semiconductor substrate at the first opening and a second trench having the first depth in an exposed portion of the semiconductor substrate at the second opening; (c) depositing a first insulating film isotropically over the entire surface of the semiconductor substrate of the step (b) to completely fill up the first trench and to leave a space in a central portion of the second trench; (d) etching back the first insulating film to expose the semiconductor substrate at the central portion of the second trench and to leave part of the first insulating film as sidewalls of the second trench; (e) etching the semiconductor substrate using the sidewalls as a mask to form a third trench having a third width smaller than the second width and a second depth greater than the first depth in the second trench; (f) depositing a second insulating film that is superior in step-covering properties to the first insulating film over the entire surface of the semiconductor substrate of the step (e) to fill the third trench; and (g) performing planalization processing on the semiconductor substrate of the step (f) to remove the second insulating film which is deposited farther from the semiconductor substrate than the mask material thereby to leave the first and second insulating films only in the first through third trenches.

According to a second aspect of the present invention, in the manufacturing method of the first aspect, the first insulating film of the step (c) is a silicon oxide film formed by an LP-CVD method.

According to a third aspect of the present invention, in the manufacturing method of the first aspect, the second insulating film of the step (f) is a silicon oxide film formed by an HDP-CVD method.

A fourth aspect of the present invention is directed to a semiconductor device comprising: a semiconductor substrate having a surface; trenches having a cross-sectional shape of an inverted triangle on the surface; and an insulating film filling the trenches.

A fifth aspect of the present invention is directed to a method of manufacturing a semiconductor device comprising the steps of: (a) preparing a semiconductor device having a surface and on the surface, forming a mask material with a first opening having a first width and a second opening having a second width greater than the first width; (b) performing taper etching using the mask material as a mask to form a first trench having a first depth and a cross-sectional shape of an inverted triangle in an exposed portion of the semiconductor substrate at the first opening and a second trench having a second depth and a similar shape to the inverted triangle in an exposed portion of the semiconductor substrate at the second opening; (c) depositing an insulating film over the entire surface of the semiconductor substrate of the step (b) to completely fill the first and second trenches; and (d) performing planarization processing on the semiconductor substrate of the step (c) to remove the insulating film which is deposited farther from the semiconductor substrate than the mask material thereby to leave the insulating film only in the first and second trenches.

The manufacturing method according to the first aspect requires only a single resist patterning to form both deep and shallow trench isolation regions in a self-aligned manner, so that the manufacturing steps thereof are simple and easily adaptable to higher density of a device. Further, filling the trenches completely with the insulating film hardly develops a short circuit between regions to be electrically isolated. Furthermore, the trench filling using the insulating film causes less stress and crystal defects in the semiconductor substrate than polycrystalline silicon is deposited in the trenches and then oxidized. This increases device reliability. In addition, the nonuse of polycrystalline silicon for the trench filling avoids the necessity of forming films for protecting the side faces or bottoms of the trenches.

With the method of manufacturing a semiconductor device according to the second aspect, the surface shape is directly reflected to the silicon oxide film to be deposited thereon by the LP-CVD method. This facilitates the formation of sidewalls.

The method of manufacturing a semiconductor device according to the third aspect ensures the deposition of the silicon oxide film formed by the HDP-CVD method regardless of the size of the trenches, wherein the third trench is filled up with reliability. Thus, utilizing the silicon oxide film formed by the HDP-CVD method for the trench isolation regions increases insulation reliability of those regions.

The semiconductor device according to the fourth aspect has the trenches filled with the insulating film, so that it develops less short circuit between regions to be electrically isolated than the trenches are filled with polycrystalline silicon. The device. further causes less stress and crystal defects in the semiconductor substrate than the trenches are filled with polycrystalline silicon and part of that silicon is oxidized. This increases device reliability.

The method of manufacturing a semiconductor device according to the fifth aspect has, besides the effects of the first aspect, an effect of forming a trench having a depth proportional to the width of an opening because the surface of the semiconductor substrate is etched under a condition of a given tilt angle.

Thus, an objective of the present invention is to form trench isolation regions having different depths depending on each purpose of isolation through the manufacturing steps that are simple and easily adaptable to higher density of a device and also to improve reliability of a semiconductor device as compared to the conventional techniques to improve yield of the products.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

A method of manufacturing a semiconductor device according to a first preferred embodiment is shown in FIGS. 1 through 7. First, a mask material 105 to be a mask in trench formation is formed across the surface of a semiconductor substrate 101 such as a silicon substrate. The mask material 105 is, for example, a silicon nitride film having a thickness in the range of about 50 to 300 nm. The silicon nitride film serves not only as a mask in trench formation but also as a stopper film in planarizing the surface of the substrate 101 by CMP processing in the later stage. Prior to the formation of the mask material 105, an underlying film 104 may be formed for adequately forming the mask material 105 on the substrate 101. The underlying film 104 is, for example, a silicon oxide film having a thickness in the range of about 5 to 50 nm formed by thermal oxidation.

Figure 1:
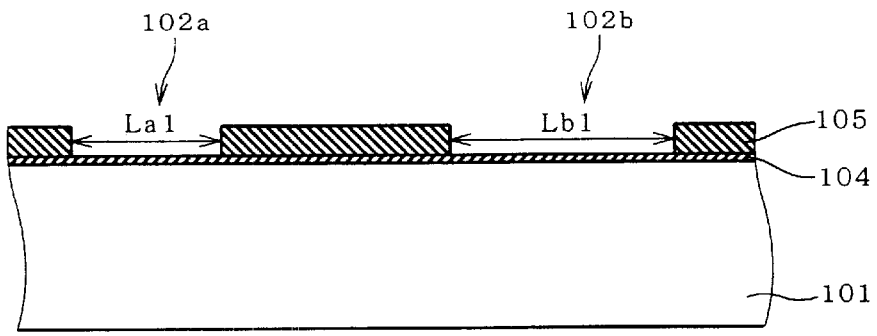
FIGS. 1 through 7 show each step of a method of manufacturing a semiconductor device according to a first preferred embodiment.
Figure 2:
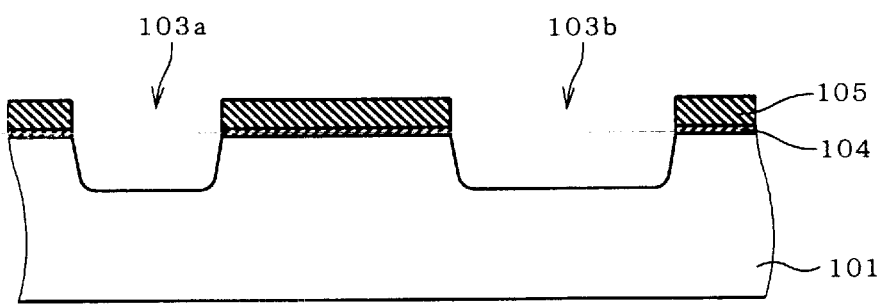
Figure 3:
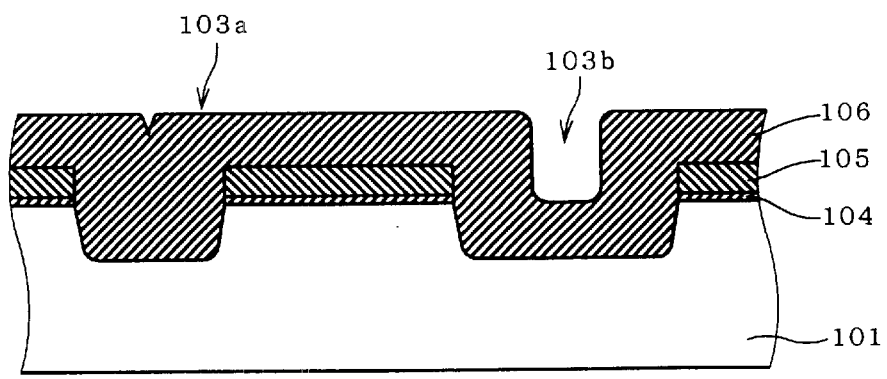

Then, a resist (not shown) formed on the surface of the mask material 105 is patterned using a photomask, and openings 102a and 102b having isolation lengths La1 and Lb1 (La1<Lb1), respectively, are formed by anisotropic etching in portions of the mask material 105 where trench isolation regions are to be formed (FIG. 1). Further, the underlying film 104 at the openings 102a and 102b is also opened to etch the substrate 101 to a depth of about 50 to 500 nm thereby to form trenches 103a and 103b of the same depth (FIG. 2). Then, an insulating film 106 is deposited isotropically to fill the trenches 103a and 103b. The insulating film 106 is, for example, TEOS (Tetra-Ethyl-OrthoSilicate) deposited over the entire surface by an LP (Low Pressure) -CVD method (FIG. 3). The thickness of the insulating film 106 is adjusted to be greater than about one half of the isolation length La1 of the trench 103a but smaller than about one half of the isolation length Lb1 of the trench 103b. Accordingly, as shown in FIG. 3, the trench 103a is completely filled with the insulating film 106, but the trench 103b has an unfilled space in its central portion.

Figure 4:
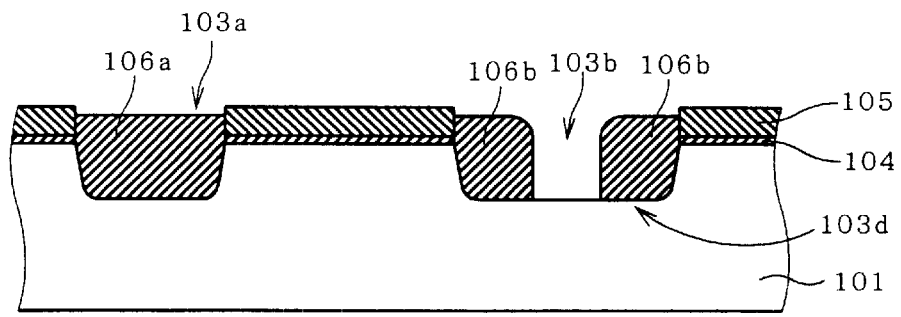
Figure 5:
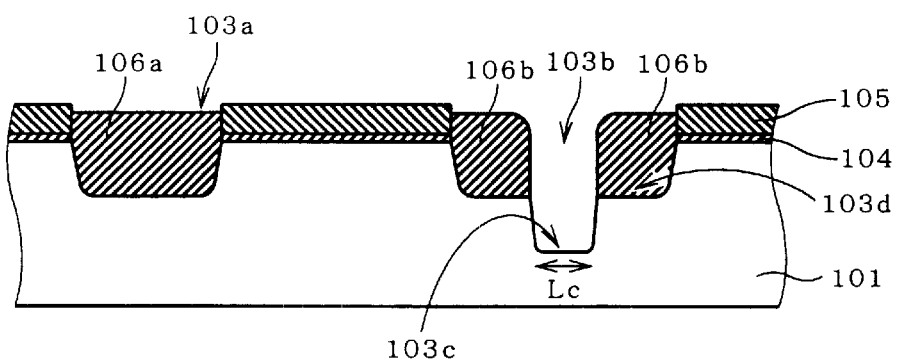
Figure 6:
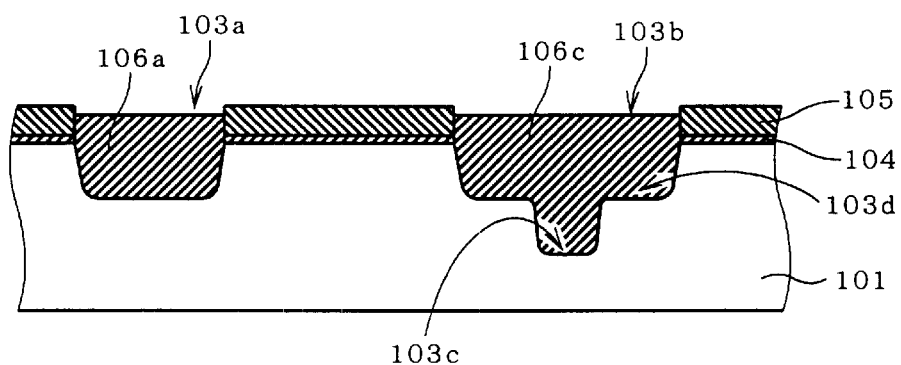
Figure 7:
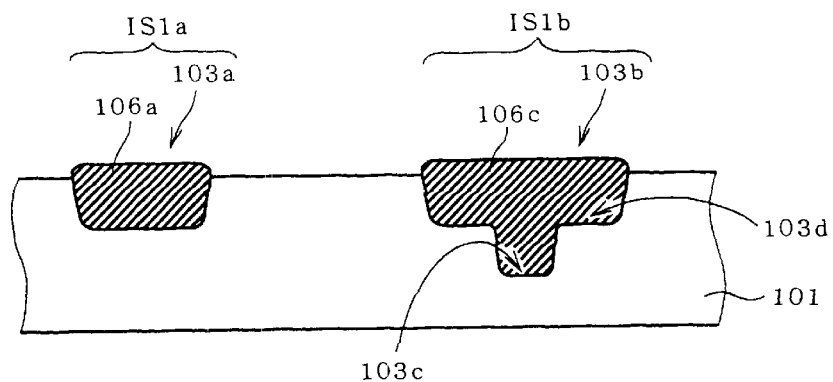

The deposited insulating film 106 is then etched back by its own thickness so that the substrate 101 is exposed at the central portion of the bottom 103d of the trench 103b. Consequently, while the trench 103a is still filled with an insulating film 106a, in the trench 103b a sidewall insulating film 106b is left on the side faces (FIG. 4). By etching this state of the substrate 101 again to a depth of about 50 to 500 nm using the insulating film 106a, the mask material 105, and the sidewall insulating film 106b as masks, only the central portion of the bottom 103d of the trench 103b is etched, forming a deeper second bottom 103c (FIG. 5). That is, the T-shaped trench 103b is formed. The remaining portion of the trench 103b is then filled with an insulating film. That insulating film must be superior in step-covering properties to the previously formed insulating film 106, so it is appropriate to deposit a silicon oxide film by an HDP (High Density Plasma) -CVD method. After that, surface planarity is produced, for example, by the CMP method using the mask material 105 as a stopper film, thereby completing an insulating film 106c as a filler material of the trench 103b (FIG. 6). Then, through the removal of the mask material 105 and the underlying film 104 (for example, removing a silicon nitride film by wet etching using high-temperature phosphoric acid; and a silicon oxide film by wet etching using hydrofluoric acid), a semiconductor device having trench isolation regions IS1a and IS1b of different depths is completed (FIG. 7).

In cases where a silicon oxide film is utilized as an insulating film, as described above, the one to be deposited in a shallow portion should be formed by depositing TEOS using the LP-CVD method and the one to be deposited in a deep portion should be formed by the HDP-CVD method. Under the LP-CVD method, a silicon oxide film is formed isotropically, reflecting almost the shape of the surface to be deposited as shown in FIG. 3.

On the other hand, the HDP-CVD method has an advantage of ensuring the formation of a silicon oxide film regardless of the size of trenches. That is, this method provides a silicon oxide film that is superior in step-covering properties to that formed by the LP-CVD method. Thus, utilizing the silicon oxide film formed by the HDP-CVD method for the trench isolation regions increases insulation reliability of those regions.

Figure 19:
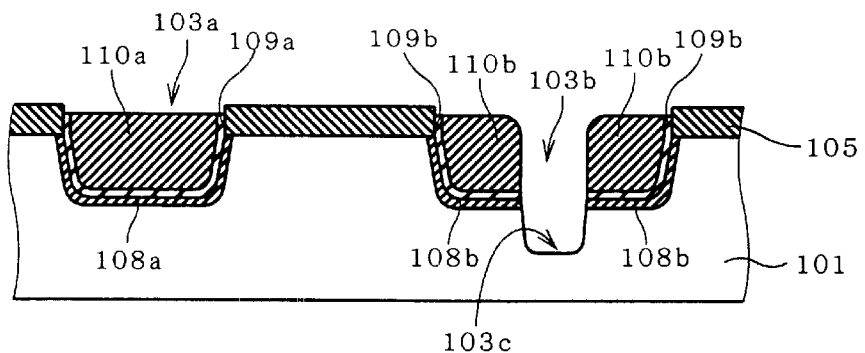
Figure 20:
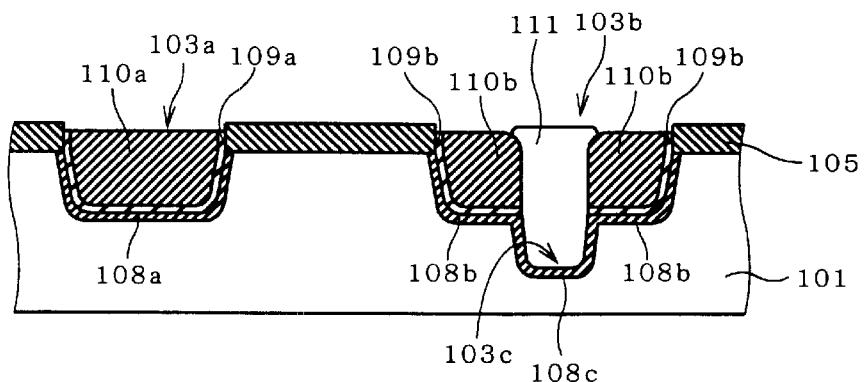
Figure 21:
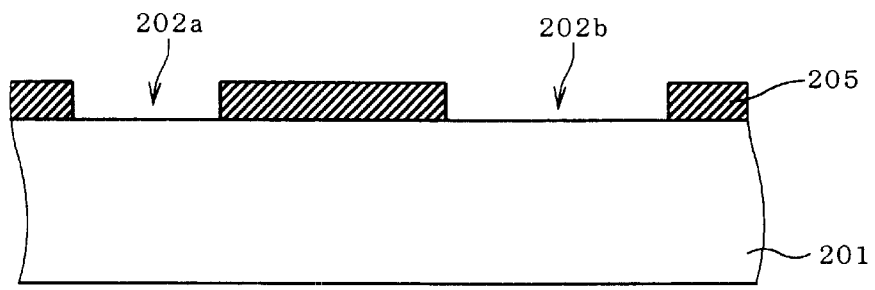
Figure 22:
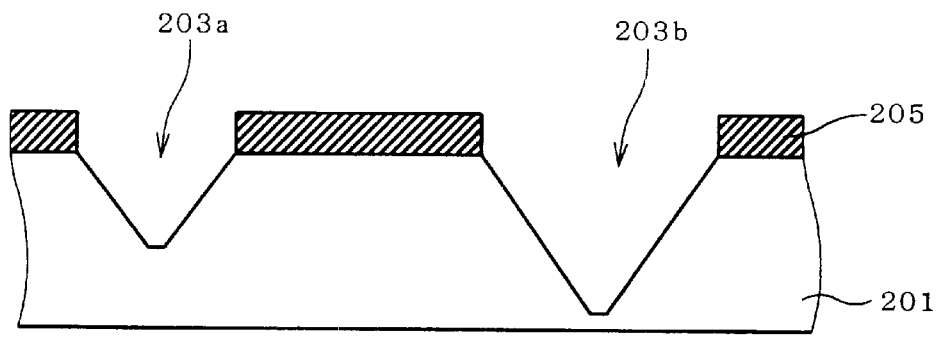
Figure 23:
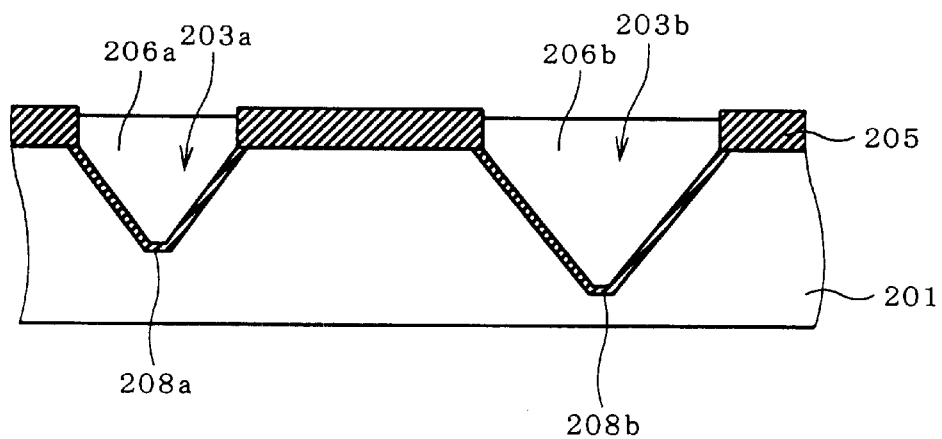

Accordingly, the LP-CVD method is suitable for the formation of a silicon oxide film in the shallow trenches 103a and 103b because it reflects the surface shape directly to the silicon oxide film to be deposited thereon, thereby fulfilling the need to form the sidewall insulating film 106b, while the HDP-CVD method is suitable for the formation of a silicon oxide film in the deep trench having the second bottom 103c, surrounded by the sidewall insulating film 106b. In these respects, the first preferred embodiment brings more advantages than the case where, by modifying the conventional techniques shown in FIGS. 16 through 20, a silicon oxide film is deposited by the LP-CVD method to fill the remaining portion of the trench 103b after the step of FIG. 19.

We will now consider differences between the first preferred embodiment and a case where a semiconductor substrate 101a with the trench 103a and the T-shaped trench 103b is formed by using a technique disclosed in U.S. Pat. No. 5,536,675 and then an insulating film 106d is newly deposited over the entire surface.

Figure 8:
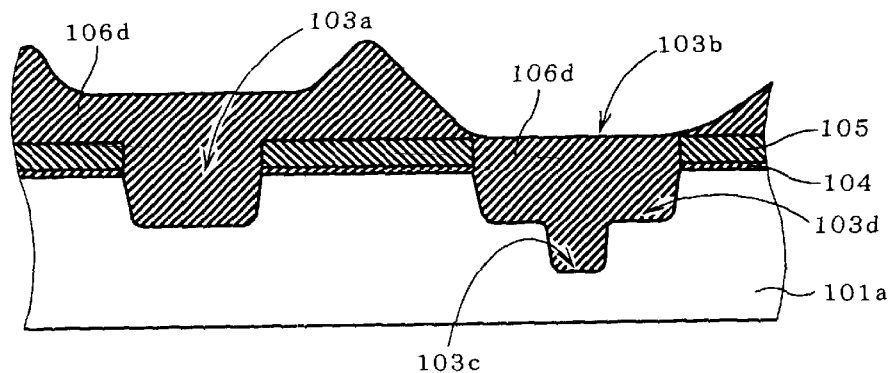
FIG. 8 illustrates a problem of the conventional method of manufacturing a semiconductor device.
Figure 9:
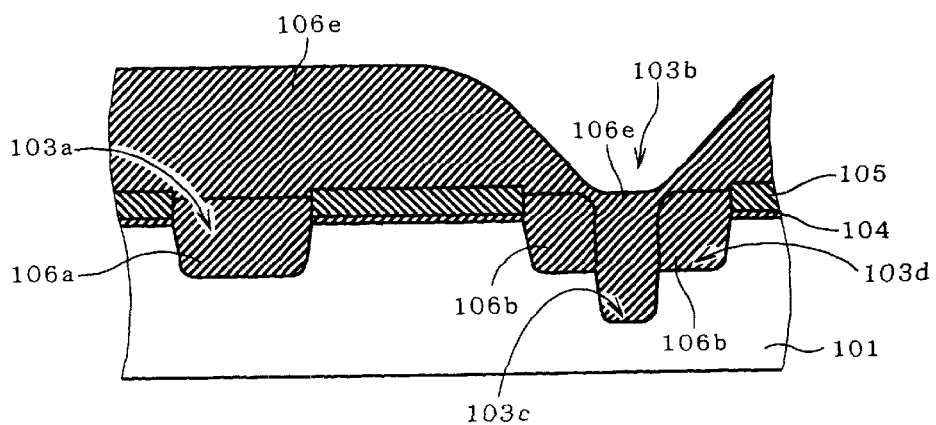
FIG. 9 illustrates an advantage of the method of manufacturing a semiconductor device according to the first preferred embodiment.

In cases where a silicon oxide film is utilized as the insulating film 106d, from the above reasons, the HDP-CVD method should be adopted since the second bottom 103c has already been formed in the trench 103b. FIG. 8 shows that the silicon oxide film 106d is formed across the semiconductor substrate 101a by the HDP-CVD method. FIG. 9, on the other hand, shows that a silicon oxide film 106e is formed across the semiconductor substrate 101 by the HDP-CVD method after the stage in FIG. 5 of the first preferred embodiment.

Comparing FIG. 8 with FIG. 9, the silicon oxide film 106d in FIG. 8 has more inequalities. Under the HDP-CVD method, a silicon oxide film is formed with sloped sidewalls of about 45 degrees in the periphery of a trench, and further the film is deposited from the bottom of the trench rather than the side faces unlike the LP-CVD method in which it is formed isotropically on both bottom and side faces. Thus, a shallower trench will be filled earlier and more completely, and filling several trenches of different depths simultaneously causes a lot of inequalities as shown in FIG. 8. Having many inequalities on the substrate creates a difficulty in producing surface planarity of the substrate 101 by the CMP method, etc. in the later stage. Thus, on the back of the aforementioned photomask problem, the first preferred embodiment is more advantageous in this respect than the technique disclosed in U.S. Pat. No. 5,536,675.

The isolation length Lb1 of the opening 102b has to be equal to or larger than a sum of the width Lc of the second bottom 103c of the trench 103b and the isolation length La1 of the opening 102a. When the isolation length La1 of the opening 102a and the width Lc of the second bottom 103c are both a minimum isolation width L, the isolation length Lb of the opening 102b has to be at least 2 L or more.

The manufacturing method of the first preferred embodiment requires only a single resist patterning using a photomask to form both deep and shallow trench isolation regions in a self-aligned manner, so that the manufacturing steps thereof are simple and easily adaptable to higher density of devices. Further, filling the trenches completely with the insulating film hardly develops a short circuit between regions to be electrically isolated. Furthermore, the trench filling using the insulating film is accomplished by direct deposition of a silicon oxide film, for example, by the CVD method. This causes less stress and crystal defects in the semiconductor substrate than polycrystalline silicon is deposited in the trenches and then oxidized. This increases device reliability. In addition, the nonuse of polycrystalline silicon for the trench filling avoids the necessity of forming films for protecting the side faces or bottoms of the trenches, such as the insulating films 108a, 108b, 108c and the oxidation-resistant film 109a, 109b of the conventional techniques shown in FIG. 20.

Second Preferred Embodiment

Figure 10:
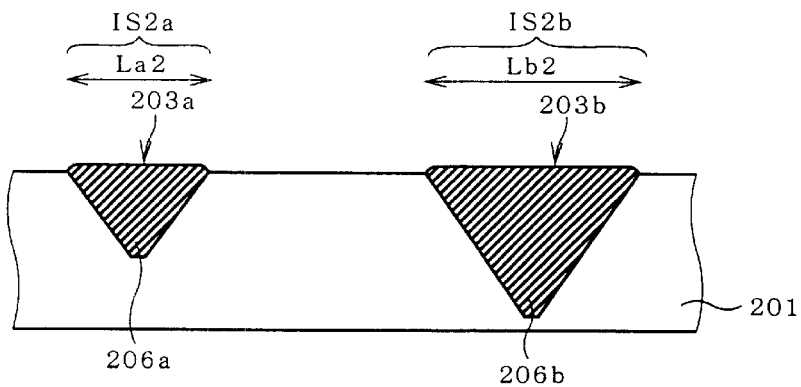
FIG. 10 is a cross-sectional view showing the structure of a semiconductor device according to a second preferred embodiment.

The structure of a semiconductor device according to a second preferred embodiment is shown in FIG. 10. This semiconductor device comprises a semiconductor substrate 201 (e.g., silicon substrate) and trench isolation regions IS2a and IS2b having isolation lengths La2 and Lb2 (La2<Lb2), respectively, on the substrate. The trench isolation regions IS2a and IS2b are formed by filling trenches 203a and 203b, for example, with insulating films, 206a and 206b such as a silicon oxide film, both having a crosssectional shape of about an inverted triangle. Those two trench isolation regions IS2a and IS2b are similar in shape, but the trench isolation region IS2b has a deeper trench structure than the trench isolation region IS2a.

In the semiconductor device of the second preferred embodiment, the trenches are completely filled with the insulating films, causing less short circuit between regions to be electrically isolated than the trenches are filled with polycrystalline silicon. Further, less stress and crystal defects occur in the semiconductor substrate than the trenches are filled with polycrystalline silicon and part of the silicon are oxidized. This increases device reliability.

Third Preferred Embodiment

Figure 11:
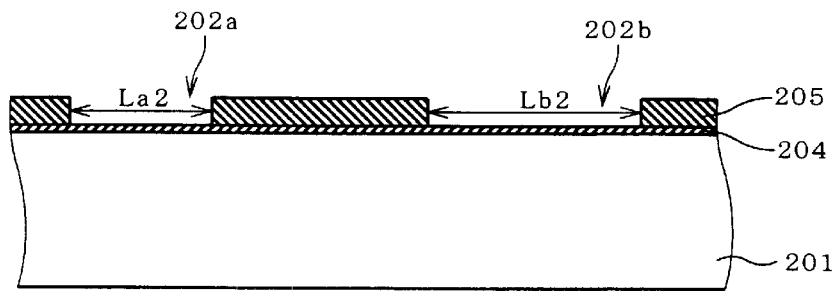
FIGS. 11 and 12 show each step of a method of manufacturing a semiconductor device according to a third preferred embodiment.
Figure 12:
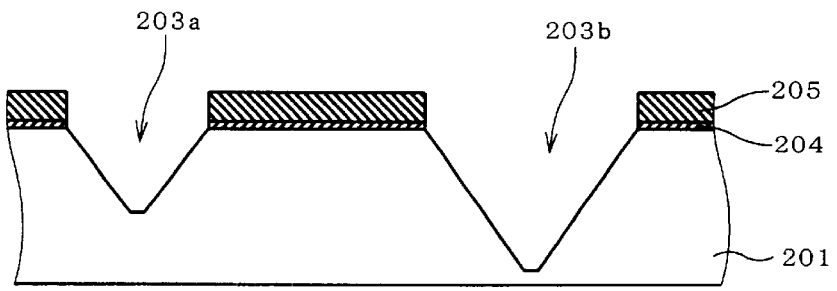
Figure 13:
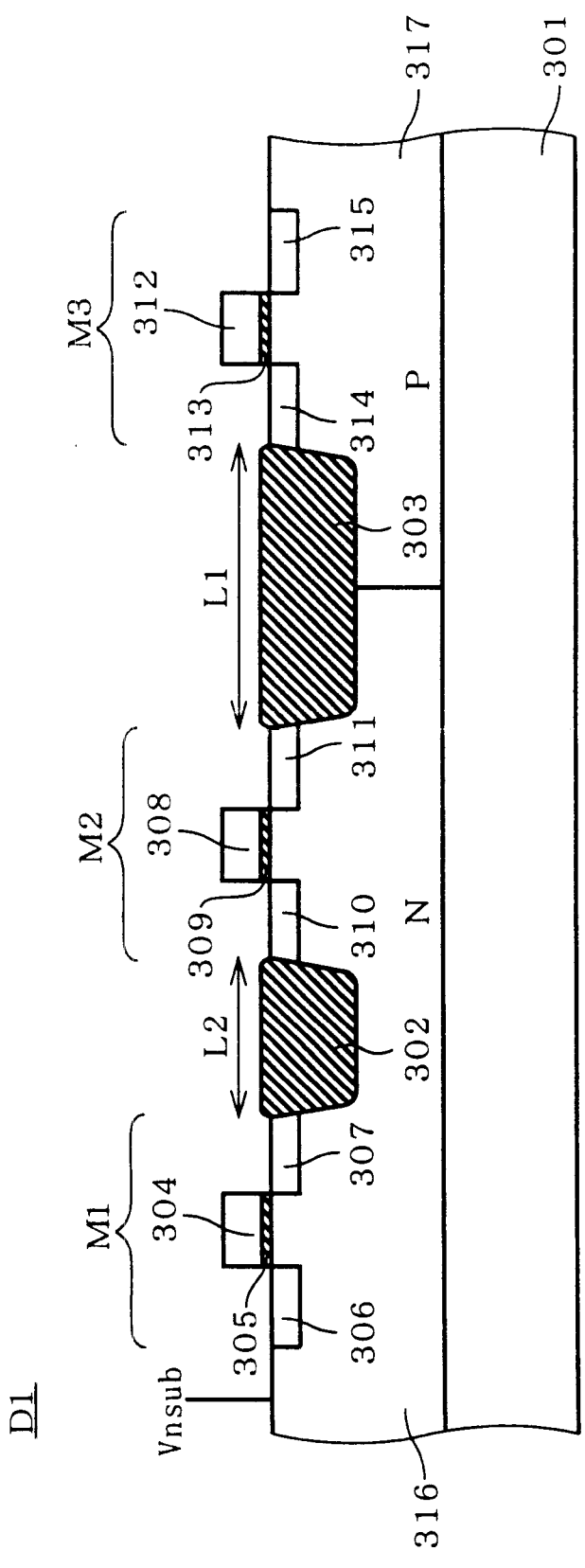
FIGS. 13 through 15 are cross-sectional views showing the structure of a conventional semiconductor device.
Figure 14:
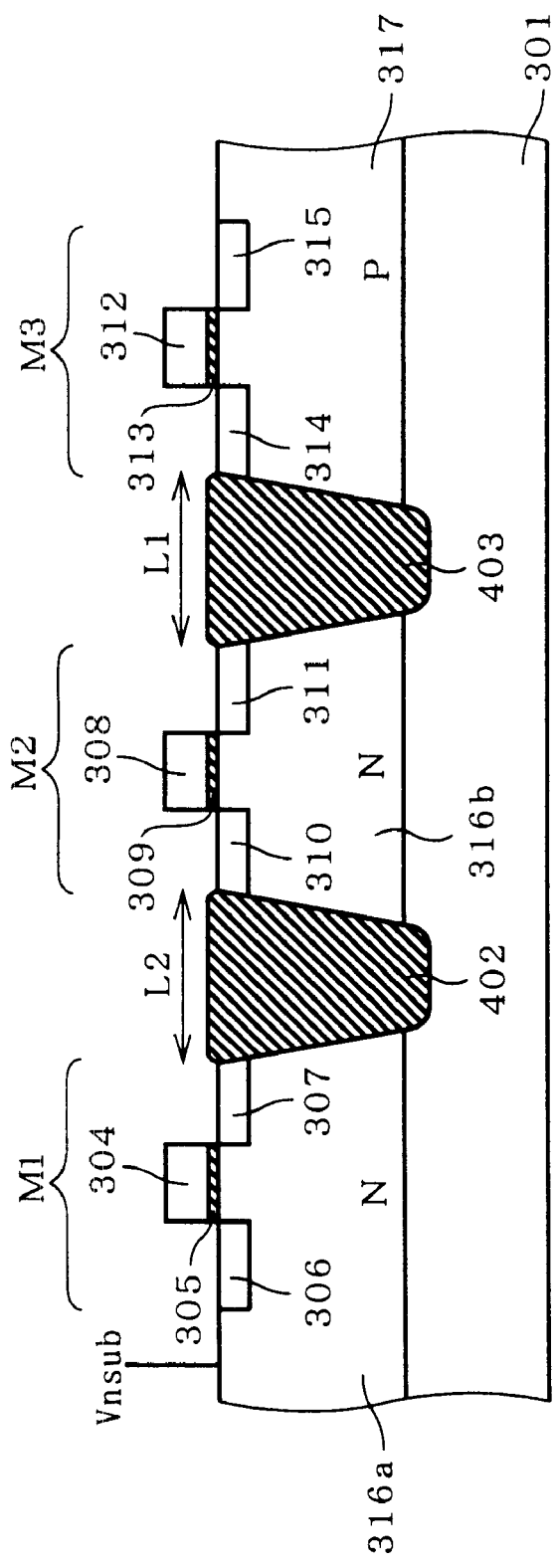
Figure 15:
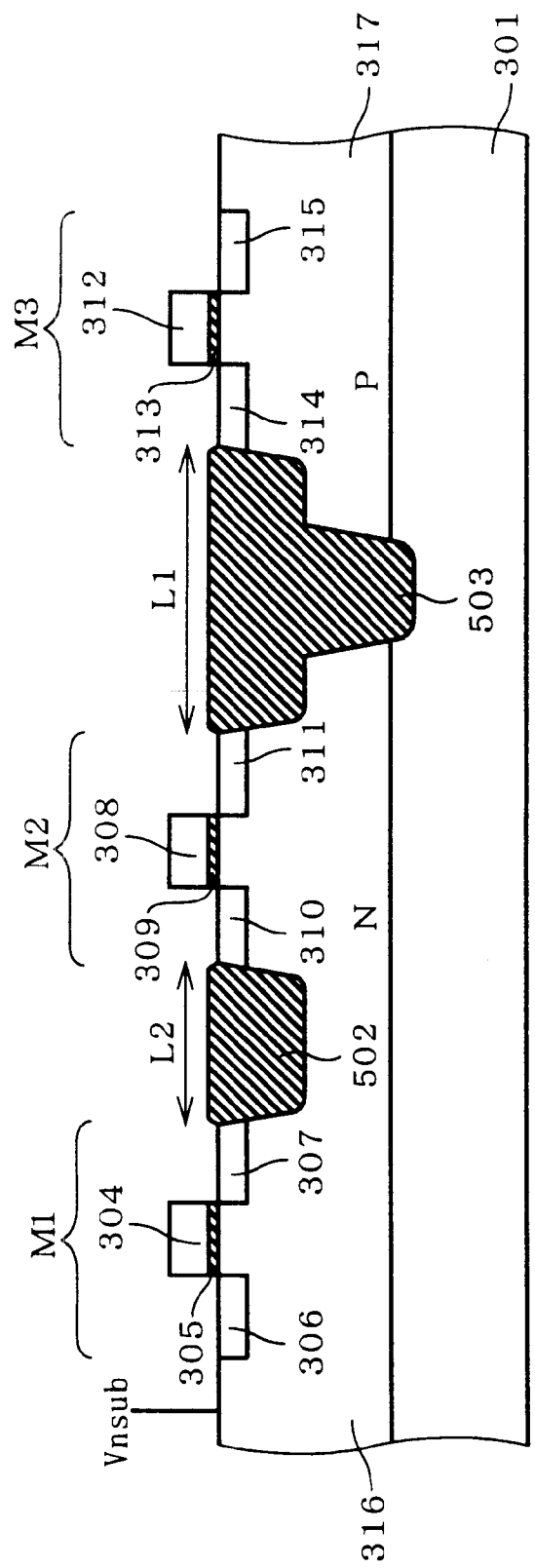
Figure 16:
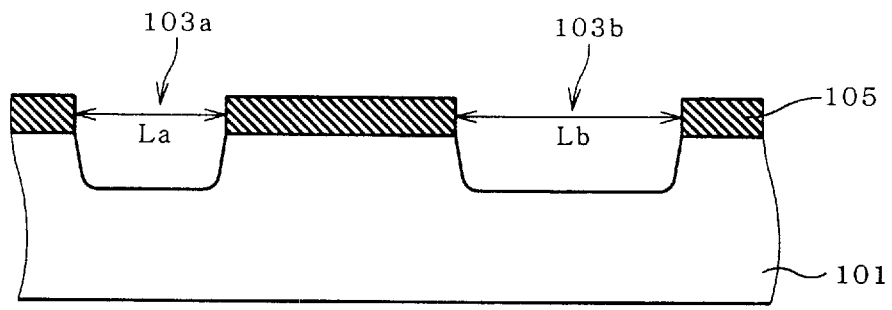
FIGS. 16 through 23 show each step of a method of manufacturing conventional semiconductor devices.
Figure 17:
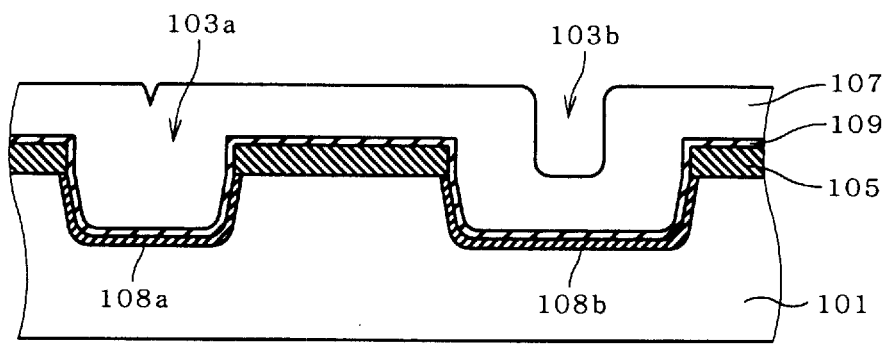
Figure 18:
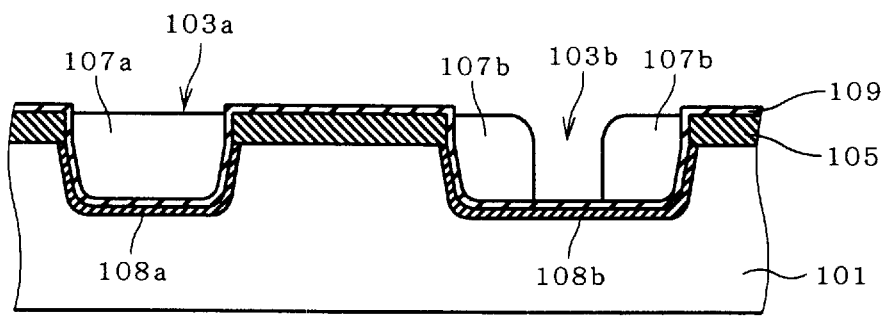

A third preferred embodiment is a method of manufacturing the semiconductor device of the second preferred embodiment. FIGS. 11 and 12 show the method of manufacturing a semiconductor device according to the third preferred embodiment. First, a mask material 205 to be a mask in trench formation is formed across a semiconductor substrate 201 such as silicon substrate. The mask material 205 is, for example, a silicon nitride film having a thickness in the range of about 50 to 300 nm. The silicon oxide film serves not only as a mask in trench formation but also as a stopper film in planarizing the surface of the substrate 201 by the CMP processing in the later stage. Prior to the formation of the mask material 205, an underlying film 204 may be formed for adequately forming the mask material 205 on the substrate 201. The underlying film 204 is, for example, a silicon oxide film having a thickness in the range of about 5 to 50 nm formed by thermal oxidation.

Then, a resist (not shown) formed on the surface of the mask material 205 is patterned using a photomask, and openings 202a and 202b having isolation lengths La2 and Lb2 (La2<Lb2) respectively, are formed by anisotropic etching in portions of the mask material where trench isolation regions are to be formed (FIG. 11). The underlying film 204 is also opened to etch the substrate 201 thereby to form trenches 203a and 203b. This etching is accomplished by a taper etch method for etching the substrate 201 in the shape of a wedge while maintaining the etch surface at a constant angle to the substrate surface. Thus, the substrate is etched in the shape of an inverted triangle. Taper etching has an advantage of automatic etch stop. When taper etching is performed at an angle of 60 degrees to the surface of the substrate 201, for example, it will stop at the depth about 0.85 times the widths of the openings 202a and 202b. In this fashion, the shallow trench 203a and the deep trench 203b both in the shape of an inverted triangle are formed in the narrow opening 202a and the wide opening 202b, respectively, as shown in FIG. 12. Here, it is noted that mixed gas of HBr and Cl, for example, may be used in the taper etching of the silicon substrate. Since HBr gas shows a weak etching reaction and a strong deposition reaction to the substrate, appropriate proportion of HBr in the mixed gas will be able to achieve a taper angle of about 60 degrees.

Next, an insulating film such as silicon oxide film is deposited across the surface by the CVD method to fill the inverted-triangular trenches 203a and 203b. The insulating film deposited on the upper portions of the trenches 203a and 203b is then removed by the CMP method, using the mask material 205 as a stopper, to form insulating films 206a and 206b. Then, through the removal of the mask material 205 and the underlying film 204, a semiconductor device having the trench isolation regions IS2a and IS2b of different depths is completed (FIG. 10).

The method of manufacturing the semiconductor device of the third preferred embodiment has similar effects to that of the first preferred embodiment. In addition, the use of taper etching facilitates the trench formation because the etching stops automatically at a depth related to the width of an opening.

While the invention has been described in detail, the foregoing description is in all aspects illustrative and not restrictive. It is understood that numerous other modifications and variations can be devised without departing from the scope of the invention.

We claim:

1. A method of manufacturing a semiconductor device, comprising the steps of:

(a) preparing a semiconductor device having a surface and on said surface, forming a mask material with a first opening having a first width and a second opening having a second width greater than said first width;

(b) performing taper etching using said mask material as a mask to form a first trench having a first depth and a cross-sectional shape of an inverted triangle in an exposed portion of said semiconductor substrate at said first opening and a second trench having a second depth and a similar shape to said inverted triangle in an exposed portion of said semiconductor substrate at said second opening;

(c) depositing an insulating film over the entire surface of said semiconductor substrate of said step (b) to completely fill said first and second trenches with said insulating film by said depositing step (c); and (d) performing planalization processing on said semiconductor substrate of said step (c) to remove said insulating film which is deposited farther from said semiconductor substrate than said mask material thereby to leave said insulating film only in said first and second trenches.

2. The method of manufacturing a semiconductor device according to claim 1, wherein said insulating film of said step (c) is a silicon oxide film.

3. The method of manufacturing a semiconductor device according to claim 1, wherein said planalization processing is accomplished by a CMP method using said mask material as a stopper film.

4. The method of manufacturing a semiconductor device according to claim 3, wherein in said step (a), an underlying film is further formed between said mask material and said surface.

5. The method of manufacturing a semiconductor device according to claim 4, wherein said mask material is a silicon nitride film, and said underlying film is a silicon oxide film.

6. The method of manufacturing a semiconductor device according to claim 1, wherein when said semiconductor substrate is a silicon substrate, mixed gas of HBr and Cl is used in said taper etching of said step (b).

* * * * *

UNITED STATES PATENT AND TRADEMARK OFFICE
CERTIFICATE OF CORRECTION

PATENT NO. : 6,461,934 B2
DATED : October 8, 2002
INVENTOR(S) : Nishida et al.

It is certified that error appears in the above-identified patent and that said Letters Patent is hereby corrected as shown below:

<u>Title page,</u>
Item [30], Foreign Application Priority Data, should read as follows:
-- [30]   Foreign Application Priority Data
Nov. 13, 1998   (JP) ................................ 10-323390 --

Signed and Sealed this

Fourth Day of February, 2003

JAMES E. ROGAN
*Director of the United States Patent and Trademark Office*